(12) United States Patent
Anderson

(10) Patent No.: US 7,271,012 B2
(45) Date of Patent: Sep. 18, 2007

(54) FAILURE ANALYSIS METHODS AND SYSTEMS

(75) Inventor: Gregory B. Anderson, Kissimmee, FL (US)

(73) Assignee: Control Systemation, Inc., Orlando, FL (US)

( * ) Notice: Subject to any disclaimer, the term of this patent is extended or adjusted under 35 U.S.C. 154(b) by 0 days.

(21) Appl. No.: 10/891,828

(22) Filed: Jul. 14, 2004

(65) Prior Publication Data

US 2005/0064682 A1   Mar. 24, 2005

Related U.S. Application Data

(60) Provisional application No. 60/487,870, filed on Jul. 15, 2003.

(51) Int. Cl.
  *G01R 31/26* (2006.01)
(52) U.S. Cl. ............... 438/14; 257/E21.53; 438/690
(58) Field of Classification Search ........... 438/690, 438/14, 940; 257/E21.521, E21.53
  See application file for complete search history.

(56) References Cited

U.S. PATENT DOCUMENTS

| | | | | |
|---|---|---|---|---|
| 5,952,271 | A * | 9/1999 | Moto et al. ............... | 505/474 |
| 5,986,234 | A | 11/1999 | Matthews et al. ....... | 219/121.68 |
| 6,107,600 | A | 8/2000 | Kurosawa ............... | 219/121.8 |
| 6,414,320 | B1 * | 7/2002 | Ishikawa et al. ......... | 250/425 |
| 6,752,966 | B1 | 6/2004 | Chazan | |
| 2001/0028253 | A1 * | 10/2001 | Zellner et al. .......... | 324/661 |
| 2001/0028390 | A1 * | 10/2001 | Hayashi .................. | 347/262 |
| 2002/0030040 | A1 | 3/2002 | Farmworth ........... | 219/121.69 |
| 2002/0107603 | A1 | 8/2002 | Canella ................. | 700/121 |
| 2003/0010761 | A1 * | 1/2003 | Hong et al. ........... | 219/121.69 |
| 2003/0178396 | A1 | 9/2003 | Naumov et al. ....... | 219/121.69 |
| 2003/0222330 | A1 * | 12/2003 | Sun et al. ............... | 257/665 |
| 2004/0253545 | A1 * | 12/2004 | David ..................... | 430/311 |
| 2006/0084957 | A1 | 4/2006 | Delfyett et al. ........ | 606/12 |
| 2006/0169677 | A1 | 8/2006 | Deshi .................... | 219/121.7 |
| 2007/0012665 | A1 | 1/2007 | Nelson et al. ......... | 219/121.69 |
| 2007/0075063 | A1 | 4/2007 | Wilbanks et al. ...... | 219/121.85 |

FOREIGN PATENT DOCUMENTS

WO    WO 01/15191 A2 *   1/2001

OTHER PUBLICATIONS

Translation of WO 01/15191A2, 23 pages.*
G. Carter; "Laser Decapsulation of Transfer Molded Plastic Packages for Failure Analysis", ISTFA 2002; Proceedings of the 28th International Sysmposium for Testing and Failure Analysis; pp. 117-125.

* cited by examiner

*Primary Examiner*—Caridad Everhart
(74) *Attorney, Agent, or Firm*—Darby & Darby

(57) ABSTRACT

A method and system for exposing the delicate structures of a device encapsulated in a mold compound such as an integrated circuit (IC). A laser is used to ablate the mold compound and thus remove it, exposing the underlying structure. The laser beam can be steered in a desired raster pattern onto the surface of the device or the device can be moved in the desired pattern relative to the laser beam. Spectral analysis can be performed on the laser plume emitted by the ablation process in order to determine the composition of the ablated material. Thus, in addition to exposing defects in the underlying structure, the system can also be used to analyze the encapsulating material in order to determine whether it contained any defects or anomalies. A system for precisely cutting a circuit board or an IC in a user-selected pattern is also described. The system directs a laser along a path that a user can specify using a graphical interface.

16 Claims, 4 Drawing Sheets

FAILURE ANALYSIS METHODS AND SYSTEMS

RELATED PATENT APPLICATIONS

The present application claims priority from U.S. Provisional Patent Application No. 60/487,870 filed on Jul. 15, 2003, which is entitled FAILURE ANALYSIS METHODS AND SYSTEMS and which is incorporated herein by reference in its entirety.

FIELD OF THE INVENTION

The present invention relates to methods and systems for using an ablating laser in performing failure analysis on electrical devices and circuitry.

BACKGROUND INFORMATION

The basic structure of a typical integrated circuit (IC) comprises a rectangular semiconductor die or chip surrounded by and connected to a number of fine wire leads which are further connected to a surrounding frame of thicker metallic traces which in turn form the external pins of the IC. With the exception of the external pins, the entire assembly is typically encapsulated in a package comprised of a mold compound. When an IC is installed on a circuit board, the pins of the IC are typically soldered to corresponding pads on the circuit board. A complex IC installed on a circuit board can fail for any of a large variety of reasons, including, among others, failures of the internal die or chip, failures of the many fine wire leads attached to the die and failures of the many connection joints between the die, the wire leads and the surrounding pin frame. Determining the cause of failure of even one of many mass-produced ICs can provide valuable information for preventing future failures and improving IC manufacturing processes.

In many cases, the only way to identify the cause of failure of an IC is by a visual inspection of the interior of the IC, namely, the die, the wire leads, the pin frame and the solder connections therebetween. Moreover, physical access to interior points may also be needed to isolate problems. For instance, physical access can allow an analyzer to electrically probe sections of the IC to determine functionality. While X-ray and ultrasonic imaging techniques can provide visual information, they do not afford physical or electrical access to internal points.

Removing the molding compound that surrounds the IC die, the associated wiring and/or the pin frame can provide both visual and physical access to the critical potential failure points. Doing so, however, in a way that does not introduce further damage has proven difficult if not impossible. Conventional methods have been known to damage the very fine leads or die, making determination of the true cause of failure impossible. Furthermore, it is often desirable when performing failure analysis, to power-up and operate the IC while in an exposed state. If removing the molding compound damages the IC rendering it inoperative, such analysis is not possible.

A method and system is therefore needed that can remove the mold compound of an IC to provide both physical and visual access to the delicate interior structure of the IC without damaging said interior structure.

Another potential source of IC failures relates to the molding compound itself. Often, due to impurities or inconsistencies in the composition of the molding compound, "hot spots" or areas of elevated temperature can occur in parts of the IC which can cause or contribute to the failure or degradation of a section or all of the IC. Preventing such hot spots is particularly critical for high-speed, complex ICs which often require auxiliary cooling measures such as fans and heat sinks in their normal operation. In order to avoid such defects in the molding compound of future devices, it would be desirable to analyze the composition of the molding compound of devices that have failed in order to determine if such defects were present, the nature of such defects and the location of such defects. There are no known satisfactory methods or systems for doing so.

Another issue related to the failure analysis of electrical circuitry that has not been adequately addressed in the prior art entails the accurate cutting of the circuit board on which a failed device is installed. When performing failure analysis on a component such as an IC that is installed on a circuit board, it is often necessary or desirable to remove the component from the circuit board. Known methods include cutting the circuit board around the component using such tools as a fine diamond saw or a water jet. The widths of the cuts formed with such machines are typically 0.005"-0.030". Moreover, such mechanical methods of cutting introduce substantial vibration which may harm surrounding components or their connections to the circuit board. The potential damage to the area or components adjacent to a cut is also a concern in production processes such as singulation, in which one or more smaller circuit boards are separated from a larger board. To maximize circuit board density, it is often necessary to place components close to the edges of the boards. Conventional cutting processes, which have large cutting widths and which can cause damage to features near the cut, limit the ability to place components close to the board edges.

Because of the ever increasing density of components installed on a circuit board, a need therefore exists for a method of cutting a circuit board which provides a very fine cut and also minimizes any damage to the area surrounding the cut.

SUMMARY OF THE INVENTION

The present invention overcomes the above-discussed limitations of the prior art by advantageously employing a laser in a variety of novel methods and systems for performing failure analysis and for cutting ICs, circuit boards, and the like.

In a first exemplary embodiment of the present invention, a laser is used to remove the mold compound of an IC without damaging the delicate internal die, wire leads, solder connections and any other critical structures encapsulated within the mold compound, thereby leaving them available for visual and electrical analysis. A laser beam is focused through appropriate optics onto a plane corresponding to the surface of an IC to ablate the mold compound therefrom. The focused laser beam is moved across a selected area of the IC surface in a pattern, such as in a raster pattern, removing the mold compound in layers and going deeper into the compound with each pass. In a further embodiment, the laser beam is stationary while the IC is moved back and forth in a desired pattern by a positioning table.

The system of the present invention can also remove selected sections of mold compound to a selected depth. Using location information from imaging data, a small portion of interest of a device can be identified and exposed with the system of the present invention.

The system of the present invention can be used to detect many types of failures, including detached lead wires, bad solder joints and other damaged internal components or connections.

In addition to the aforementioned defects, the system of the present invention can also detect and analyze defects in the mold compound encapsulating the electrical elements of an IC. In a further embodiment of the present invention, a detector and spectral analyzer are provided to analyze the laser plume emitted by the ablation process, thereby providing an indication of the composition of the material being ablated. The composition of the mold compound removed can be captured and provided to the user in a three-dimensional representation.

In yet another aspect of the present invention, a system for precisely cutting selected sections of an IC, a circuit board, or the like, is provided.

DETAILED DESCRIPTION

Figure 1:
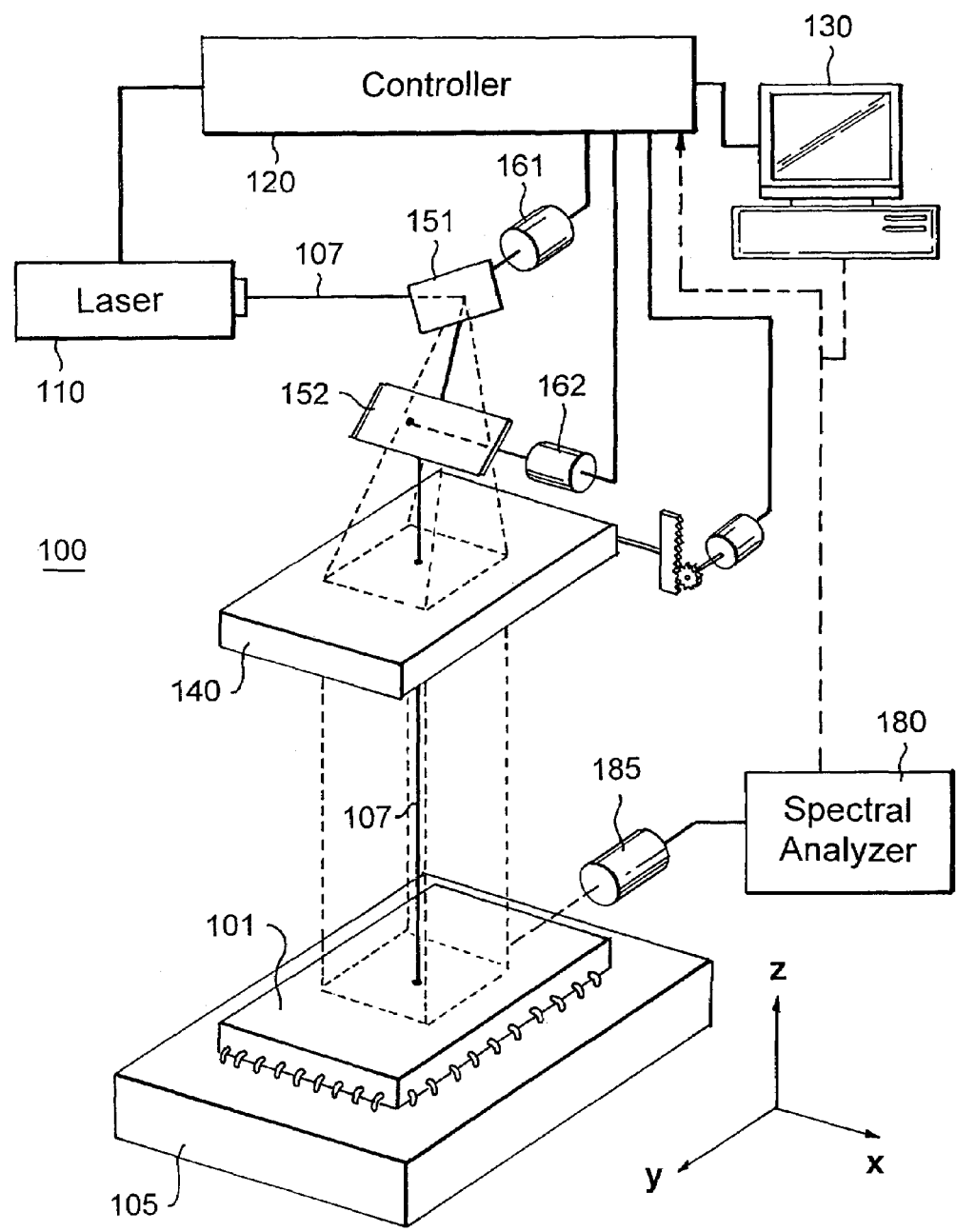
FIG. 1 is a block diagram of a first exemplary embodiment of a system in accordance with the present invention in which a laser beam is steered over a desired pattern onto a device whose encapsulating material is to be removed by laser ablation.

FIG. 1 is a block diagram of an exemplary embodiment of a system 100 in accordance with the present invention. A device to be analyzed, such as an integrated circuit (IC) 101, is placed on a platform 105 upon which a laser beam 107 generated by a laser 110 is steered and focused by a pair of reflective paddles 151 and 152 and a lens element 140. Operation is controlled by a controller 120 which may be coupled to a user interface 130 for human interaction. For example, the controller 120 and user interface 130 may be part of a workstation, personal computer or the like or may be housed separately.

During operation, the IC 101 is stationary as the beam 107 is moved over a selected portion of the surface of the IC in a selected pattern. At any one instant, the laser beam 107 impinges on one point on the surface of the IC 101. To the human eye, however, the beam may appear as a line or as a rectangle on the surface of the IC 101, depending on how fast the beam 107 is steered over the surface of the IC 101. As the beam 107 impinges on the surface of the IC 101, a small quantity of the molding compound at the point of impingement is ablated and thus removed. As the beam 107 is steered over the IC's surface, molding compound is removed in the pattern in which the beam 107 is steered.

The pattern traced by the laser beam 107 (or the pattern of ablation) can be selected to cover any desired portion of the surface of the device 101 having any of a variety of geometric shapes (e.g., rectangle, circle). The pattern is preferably selected so as to remove a uniform layer of material with each pass of the laser over the pattern. Successive layers of material are removed with successive passes of the laser over the pattern. As each layer of material is removed, the laser is directed onto the newly exposed surface of the device 101 to remove the next layer. The ablation process can be stopped at any point. Thus, in addition to removing material from a desired area of the device 101, the system can also remove the material to a desired depth.

The laser beam 107 generated by the laser 110 is deflected first by the reflective paddle 151 which is rotated about a first axis by an actuator 161. The paddle 151 deflects the beam 107 onto the reflective paddle 152, which is oriented substantially perpendicular to the paddle 151. The paddle 152 deflects the beam onto the lens element 140. Typically, the actuator 161 will cause the paddle 151 to rotate in an oscillatory pattern so that the beam will travel along a line on the paddle 152. Likewise, the actuator 162 will cause the paddle 152 to rotate in an oscillatory pattern so that the beam will travel along a two-dimensional raster pattern on the lens element 140. The reflective paddles 151 are 152 are preferably thin, having low mass. The actuators 161. and 162 are preferably high-speed galvanometer motors. The combination of low mass reflectors and high speed motors allows the focused laser beam to travel at speeds up to several thousand inches per second.

The actuators 161 and 162 are under the control of the controller 120. A laser steering sub-system that can be used in the present invention, including the paddles 151, 152, the actuators 161, 162, all of the necessary control circuitry and associated software is available from Cambridge Technology, Inc. of Cambridge, Mass.

Regardless of the orientation of the paddles 151 and 152, and the length of the path traveled by the laser beam 107, the lens element 140 serves to focus the laser beam onto a single plane. The lens element 140 can be, for example, a "flat field lens" or a "telecentric lens" which takes the laser beam input at an angle and focuses it in a plane on the output of the lens. Sources for such optics include Sil and Rodenstock of Germany.

By moving the laser beam 107 over the surface of the IC 101 at a high speed, the amount of time that the laser beam dwells at each point is very small, thus minimizing any damage that the laser may do to the delicate underlying structure that the ablation process seeks to expose. The resultant heat affected zone (HAZ) is thus kept very small (e.g., less than 1 micron). Effectively all of the mold compound of an IC can be removed leaving a functional "skeleton" of the components beneath to the point that they are electrically intact and even in a condition to be powered up.

Another consideration is the wavelength of the laser emission used. The wavelengths of green (~532 nm), UV (~266 nm), IR (~1,064 nm), and CO2 (~10,640 nm), among others, can be used. The best wavelength for an application depends on the type of material to be ablated and the composition of the underlying structures that are to be exposed. For ICs using common mold compounds, IR wavelengths have been found to work well, without damaging the more fragile underlying structures, i.e., the fine copper wires which attach the die to the IC pins. Laser with a wavelength of approximately 1319 nm can also be used for ICs, as it does not tend to damage the dies, which are primarily composed of silicon. The fine wires are not affected by IR or 1319 nm wavelengths as much as they may be by other wavelengths such as green. For instance, copper tends to reflect IR wavelengths. Therefore, by using IR wavelengths, damage to these components is further diminished, as is the HAZ. Thus, by selecting the appropriate laser wavelength based on the composition of the device to be exposed, the process of the present invention can be optimized. The present invention is not limited to laser of any particular wavelength.

The laser 110 can be Q-switched and under the control of the controller 120. A 25 Watt, diode-pumped or 75 Watt lamp-pumped IR laser, available from Quantronix Corporation of East Setauket, N.Y., can be used, among others, as the laser 110.

Figure 2:
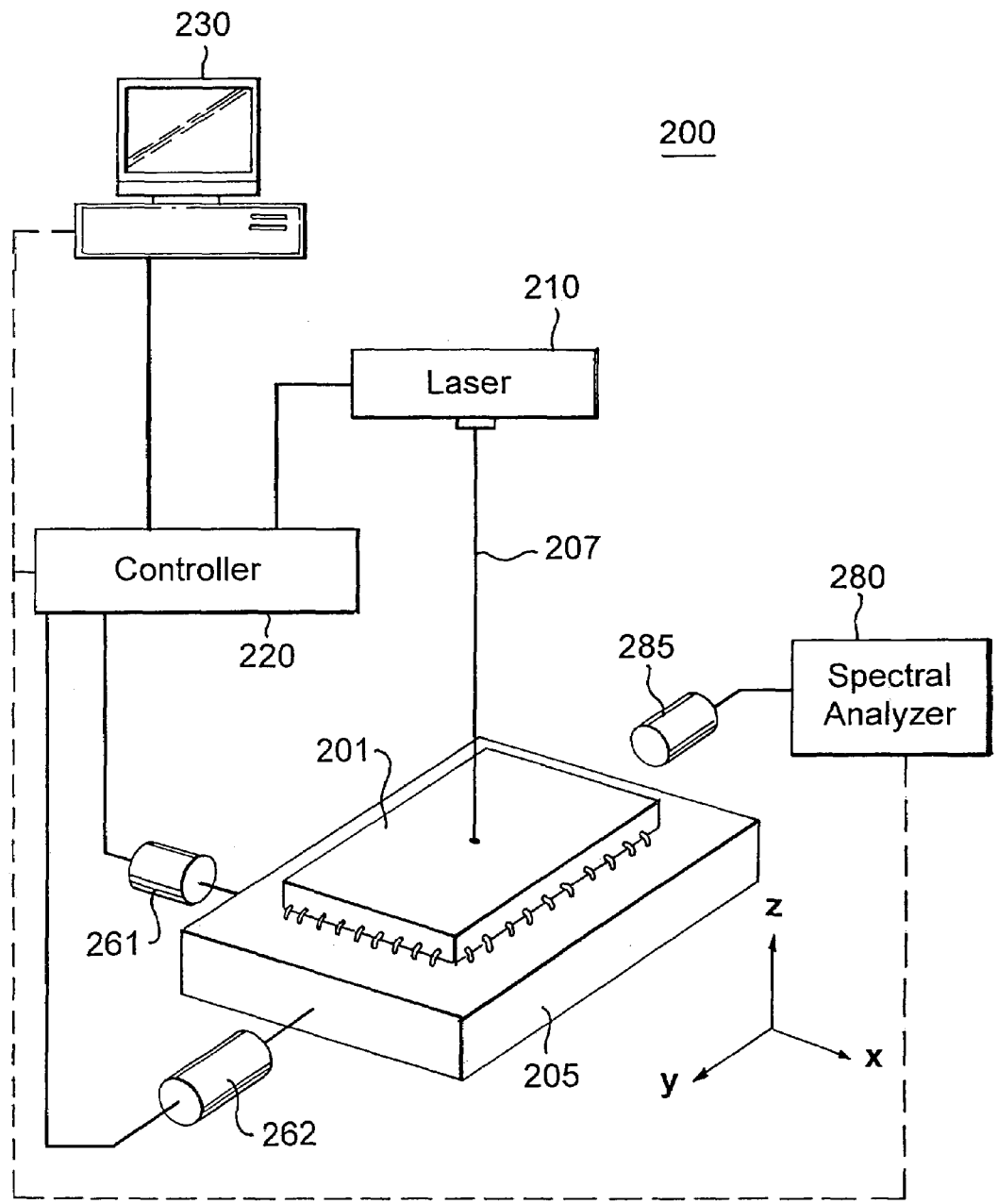
FIG. 2 is a block diagram of a second exemplary embodiment of a system in accordance with the present invention in which a laser beam is directed onto a device whose encapsulating material is to be removed by laser ablation and in which the device is moved relative to the laser in order to remove material from a selected area of the device.

FIG. 2 shows a second embodiment of a system 200 in accordance with the present invention. In this embodiment, a device to be exposed, such as an IC 201 is placed on an X-Y positioning table 205 driven by a set of actuators 261 and 262. A laser 210 generates a laser beam 207 which impinges on the surface of the IC 201. In this embodiment, the laser 210 is stationary while the IC 201 is moved relative to the laser in a desired pattern so that the laser beam 207 ablates the mold compound in accordance with the pattern. The actuators 261 and 262 may be DC servo motors, or other appropriate devices, and are controlled by a controller 220. Because of the typically larger mass of the X-Y positioning table 205 in comparison to the laser steering reflectors of the first embodiment, the speed with which the device can be moved relative to the laser beam is substantially less than in the embodiment of FIG. 1. As a result, the amount of time that the laser beam 207 dwells on any one point on the IC 201 and the time required to carry out each pass of the ablation pattern is typically substantially greater than can be achieved with the embodiment of FIG. 1.

In a further aspect of the present invention, a method of analyzing the composition of the mold compound encapsulating a device is provided. As the laser of the system of the present invention ablates the mold compound, an ablation light or "laser plume" is emitted whose spectrum is characteristic of the composition of the mold compound being ablated. By performing a spectral analysis of the emitted light, the composition of the mold compound ablated at each point along the pattern traveled by the laser can be determined and mapped to provide an image of the composition of the volume of mold compound removed.

As shown in FIG. 1, a detector 185 is provided for detecting the light emitted from the ablation process. The detector 185 is coupled to a spectral analyzer 180 for analyzing the spectrum of the light emitted. The analyzer 180 may be coupled to the controller 120 or to the human interface 130. A similar arrangement can be installed in the system of FIG. 2. A spectral analysis system that can be used in the present invention is available from Ocean Optics Inc. of Dunedin, Fla.

Figure 3:
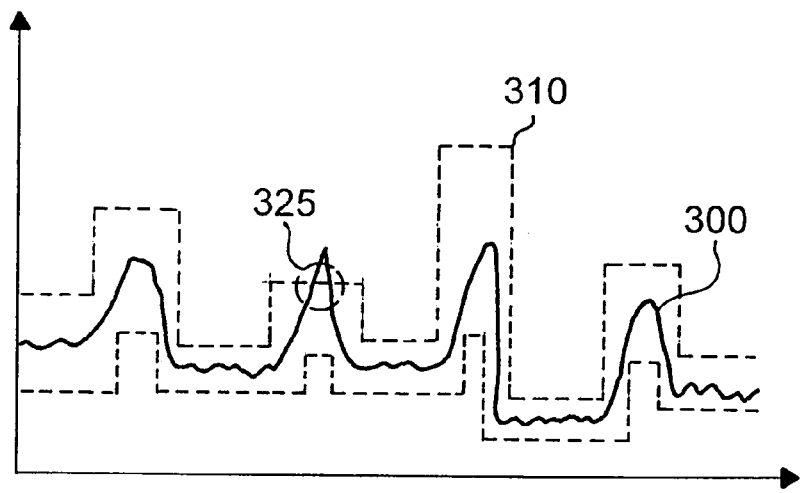
FIG. 3 shows the spectrum of light emitted from the ablation of an exemplary material. The spectrum is superimposed on an envelope within which the spectrum is expected to fall for the exemplary material.

FIG. 3 shows an exemplary spectrum 300 which may be emitted when an exemplary molding compound is ablated. An envelope 310 of expected spectral values can be determined for the mold compound in question. Such a spectral envelope 310 can be provided, for example, from the manufacturer of the mold compound. A library of spectral envelopes 310 can be maintained for a variety of mold compounds.

Figure 4:
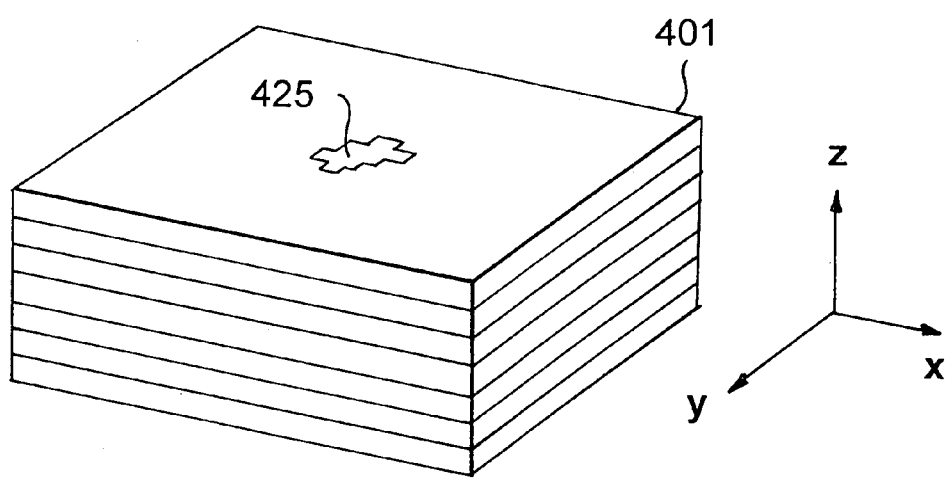
FIG. 4 shows an exemplary three-dimensional representation of a block of material removed by ablation with an anomaly detected therein using an analysis method of the present invention.

If the spectrum 300 detected for a particular compound falls out of its corresponding spectral envelope 310, as illustrated in FIG. 3 at 325, the excursion can be noted and reported to the user. In addition, when such an excursion occurs, the layer of compound in which the excursion occurred can also be captured to provide an indication of the depth (i.e., the z coordinate) of the anomaly which caused the excursion. Furthermore, the location of the laser in the layer at the time the excursion occurred (i.e., the x and y coordinates) can also be captured to provide the location in space of the anomaly within the mold compound which caused the excursion. The spectral and location information thus captured can be used to generate three-dimensional representations of the volume of mold compound removed and the anomalies detected therein. Such an exemplary representation is illustrated in FIG. 4. As shown in FIG. 4, a volume 401 of material that has been removed by the ablation process of the present invention is shown to have an anomaly 425. In addition to determining the location of the anomaly, the system can provide other measures, such as its dimensions and volume. In addition to providing spatial information of anomalies in the mold compound, the compositions of such anomalies, in the form of their spectral characteristics, can also be captured and provided to the user. The system can also be used regardless of the presence of anomalies to provide the composition of the mold compound throughout its volume.

As described above, the system of the present invention can remove material from a selected portion of a device, said portion having a selected shape, and to a selected depth into the device. This capability reduces the time required to analyze the device by limiting the process only to those portions of the device that are of interest. Moreover, this capability can be combined with information from other sources to identify and pinpoint areas of interest. For example, using imaging data from X-ray or ultrasound imaging devices, coordinates of anomalies or areas of interest identified in the imaging data can be used in the system of the present invention to remove only that portion of the mold compound required to access the areas of interest. This capability can also be used where the imaging data indicates the presence of anomalies in the mold compound. In this case, the imaging data can be used to direct the removal of mold compound from an area of interest for purposes of spectrally analyzing the mold compound at the area of interest (as opposed to exposing the encapsulated electrical structure for inspection).

Figure 5:
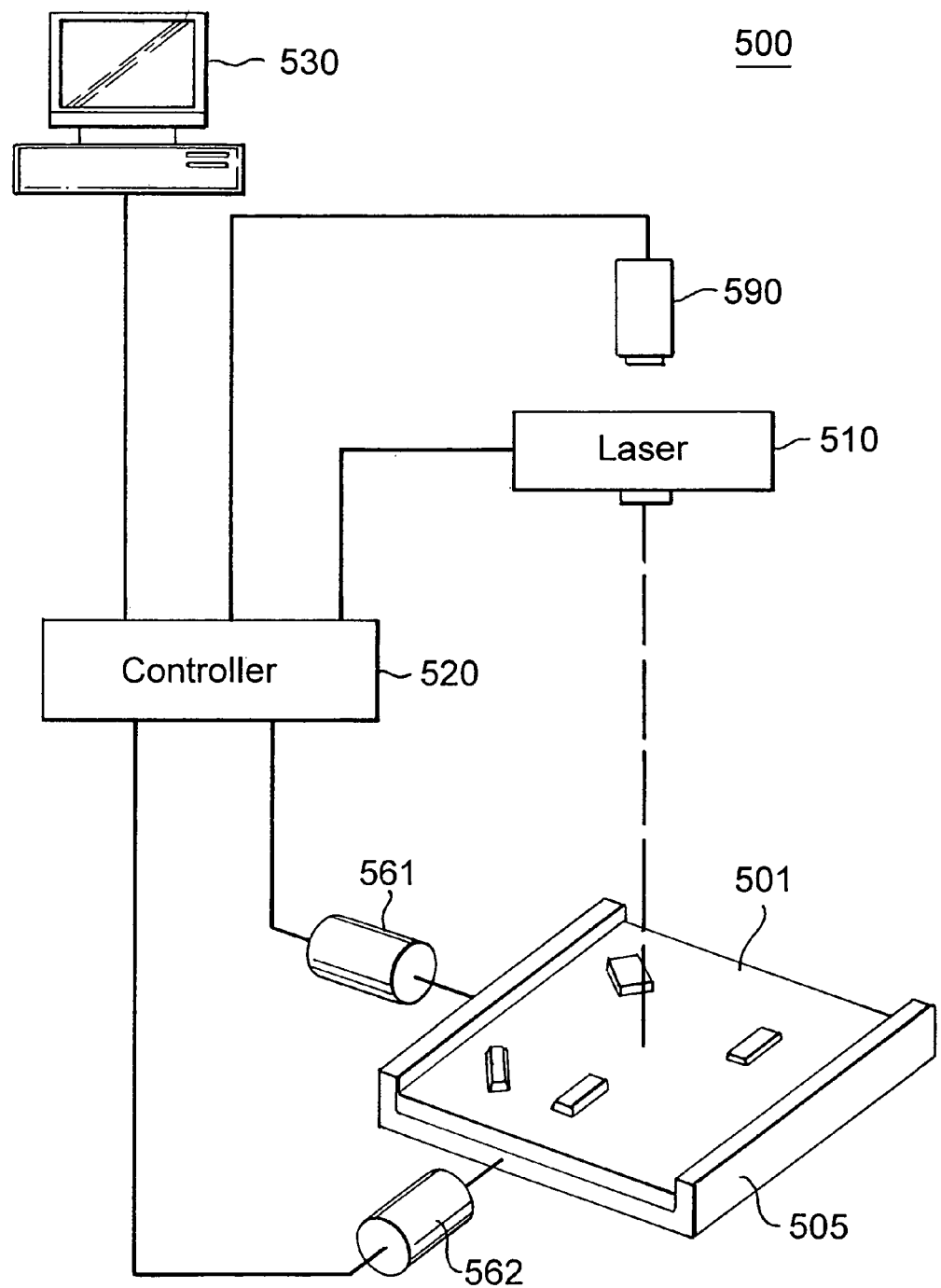
FIG. 5 is a block diagram of an exemplary embodiment of a system in accordance with the present invention in which a laser beam is directed onto an IC or a circuit board for cutting the IC or circuit board into sections.

In a further aspect of the present invention, FIG. 5 shows an exemplary embodiment of a system 500 for cutting through selected portions of a circuit board 501. In addition to removing selected components from the circuit board 501, the system of FIG. 5 can be used to cut through components and the circuit board 501 to provide cross-sectional views at selected sections. The system 500 includes a vision system 590, an X-Y positioning table 505, a laser 510, a controller 520 and a human interface 530. The circuit board 501 is placed on the position table 505 and the vision system 590 presents an image of it for display on the human interface 530. The user can then use a set of on-screen tools to draw a two-dimensional shape (including lines, arcs, rectangles, circles etc., or a combination thereof) around the area to be cut or removed. The user can also specify the depth of the cut or the system can cut entirely through the board 501. The cutting system then follows the selected shape and cuts through the circuit board removing the desired section intact. Multiple passes may be required to cut to the desired depth or completely through the board.

The system 500 can create cuts as little as 0.002 inches in width, thereby allowing it to cut extremely close to sensitive components. It can even cut through or "dissect" components, including ICs themselves, providing a precise cross sectional view inside the component. Because of the small heat affected zone (HAZ) of the lasing process, this can be done without adding damage to the area or component of interest to be analyzed. The HAZ of the system 500 is on the order of 1 micron or less. This compares to mechanical cutting widths of 0.005-0.030 inches.

Although the exemplary system of FIG. 5 provides for moving the circuit board with respect to a stationary laser, alternate embodiments in which the laser is moved or the laser beam is steered with respect to a stationary circuit board are also possible within the scope of the present invention.

In addition to analyzing electrical devices such as ICs, the present invention can be applied to any variety of applications in which encapsulated structures are to be exposed without damaging the structures. Furthermore, the system of the present invention can also be used where it is desired to determine the composition of a compound that is to be removed by laser ablation. Moreover, the system of the present invention can be adapted to a wide range of materials by using the appropriate laser, as described above.

It is to be understood that while the invention has been described above in conjunction with preferred specific embodiments, the description is intended to illustrate and not to limit the scope of the invention, as defined by the appended claims. Indeed, various modifications of the invention in addition to those described herein will become apparent to those skilled in the art from the foregoing description and the accompanying figures. Such modifications are intended to fall within the scope of the appended claims.

It is further to be understood that all values are to some degree approximate, and are provided for purposes of description.

The disclosures of any patents, patent applications, and publications that may be cited throughout this application are incorporated herein by reference in their entireties.

What is claimed is:

1. A method for exposing a structure encapsulated with a material, comprising:
   generating a laser beam;
   directing the laser beam onto the structure encapsulated with the material;
   providing at least one reflective paddle actuated by a high-speed galvanometer motor to accomplish the directing step; and
   ablating the material with the laser beam so as to expose at least an underlying portion of the structure without damaging the underlying portion.

2. The method of claim 1, wherein the encapsulated structure includes an integrated circuit.

3. The method of claim 1, wherein the laser beam has a wavelength within a range of approximately 266 nm to 10,640 nm.

4. The method of claim 1, wherein ablating the material creates a heat affected zone that is no larger than 1 micron.

5. The method of claim 1 comprising:
   providing a relative displacement between the laser beam and the encapsulated structure to ablate the material over an area.

6. The method of claim 5, wherein the encapsulated structure is moved and the laser beam is fixed.

7. The method of claim 5, wherein the laser beam is movably steered onto the encapsulated structure.

8. The method of claim 7 comprising focusing the laser beam in a plane.

9. The method of claim 8, wherein the laser beam is focused in a plane using at least one of a flat field lens and a telecentric lens.

10. A method for exposing a structure encapsulated with a material, comprising:
    generating a laser beam;
    directing the laser beam onto the structure encapsulated with the material; and
    ablating the material with the laser beam so as to expose at least a portion of the structure without damaging the structure; and
    analyzing a plume generated by ablating the material to determine a composition of the material.

11. The method of claim 10 comprising:
    determining a position of the laser beam so as to provide a spatial representation of the composition of the material.

12. An apparatus for exposing a structure encapsulated with a material, comprising:
    a laser beam source;
    a first mechanism configured to direct the laser beam onto the structure encapsulated with the material; and
    a second mechanism configured to control the position, and depth, of the laser beam so as to expose, by ablation, at least an underlying portion of the structure without damaging the underlying portion;
    wherein at least the first mechanism is a reflective paddle actuated by a high-speed galvanometer motor.

13. The apparatus of claim 12, further configured so that the laser beam is steered onto the structure.

14. The apparatus of claim 12, further configured so that the structure is moved and the laser beam is in a fixed position.

15. The apparatus of claim 12, further configured to determine the position of the laser beam so as to provide a spatial representation of the composition of the material.

16. The apparatus of claim 12, further including at least one of a flat field lens and a telecentric lens so as to focus the laser beam in a plane.

* * * * *